(12) United States Patent
Preisler et al.

(10) Patent No.: US 11,349,280 B2
(45) Date of Patent: May 31, 2022

(54) SEMICONDUCTOR STRUCTURE HAVING GROUP III-V DEVICE ON GROUP IV SUBSTRATE

(71) Applicant: Newport Fab, LLC, Newport Beach, CA (US)

(72) Inventors: Edward Preisler, San Clemente, CA (US); Oleg Martynov, Lebanon, NH (US)

(73) Assignee: Newport Fab, LLC, Newport Beach, CA (US)

( * ) Notice: Subject to any disclaimer, the term of this patent is extended or adjusted under 35 U.S.C. 154(b) by 62 days.

(21) Appl. No.: 16/745,805

(22) Filed: Jan. 17, 2020

(65) Prior Publication Data

US 2021/0218219 A1 Jul. 15, 2021

Related U.S. Application Data

(63) Continuation-in-part of application No. 16/740,173, filed on Jan. 10, 2020, and a continuation-in-part of application No. 16/741,565, filed on Jan. 13, 2020.

(51) Int. Cl.
*H01S 5/026* (2006.01)
*H01S 5/02* (2006.01)
*H01S 5/323* (2006.01)

(52) U.S. Cl.
CPC ............ *H01S 5/0262* (2013.01); *H01S 5/021* (2013.01); *H01S 5/0206* (2013.01); *H01S 5/0218* (2013.01); *H01S 5/0268* (2013.01); *H01S 5/323* (2013.01)

(58) Field of Classification Search
CPC ...... H01S 5/0206; H01S 5/021; H01S 5/0218; H01S 5/0262; H01S 5/0268
See application file for complete search history.

(56) References Cited

U.S. PATENT DOCUMENTS

| 5,937,274 | A | 8/1999 | Kondow et al. |
| 5,963,828 | A | 10/1999 | Allman et al. |
| 6,645,829 | B2 | 11/2003 | Fitzergald |

(Continued)

FOREIGN PATENT DOCUMENTS

CN 102487046 A 6/2012

OTHER PUBLICATIONS

Thomas Ferrotti. Design, Fabrication and Characterization of a Hybrid III-V on Silicon Transmitter for High-Speed Communications, Other. Université de Lyon, 2016. English. NNT : 2016LYSEC054. tel-01529424. pp. 1-181.

(Continued)

*Primary Examiner* — Michael Carter
(74) *Attorney, Agent, or Firm* — Farjami & Farjami LLP

(57) ABSTRACT

A semiconductor structure includes a group IV substrate and a patterned group III-V device over the group IV substrate. A blanket dielectric layer is situated over the patterned group III-V device. A contact metal is situated within the blanket dielectric layer and an interconnect metal is situated over the blanket dielectric layer. The blanket dielectric layer can be substantially planar. The contact metal and the interconnect metal can be electrically connected to the patterned group III-V device. The patterned group III-V device can be optically and/or electrically connected to group IV devices in the group IV substrate.

20 Claims, 14 Drawing Sheets

(56) References Cited

U.S. PATENT DOCUMENTS

| | | |
|---|---|---|
| 7,834,456 B2 | 11/2010 | Tabatabaie et al. |
| 8,633,496 B2 | 1/2014 | Hata et al. |
| 9,318,437 B1 | 4/2016 | He et al. |
| 9,331,076 B2 | 5/2016 | Bayram et al. |
| 2004/0124424 A1* | 7/2004 | Tatsumi ............... H01S 5/2231 257/79 |
| 2006/0183327 A1 | 4/2006 | Moon |
| 2009/0016399 A1 | 1/2009 | Bowers |
| 2011/0095331 A1 | 4/2011 | Hanawa et al. |
| 2012/0074980 A1 | 3/2012 | Choi et al. |
| 2012/0288971 A1 | 11/2012 | Bogaerts et al. |
| 2015/0075599 A1 | 3/2015 | Yu et al. |
| 2016/0105247 A1* | 4/2016 | Cheng .................... H01S 5/343 250/551 |
| 2016/0148959 A1 | 5/2016 | Cheng et al. |
| 2016/0380126 A1 | 12/2016 | Barkhouse et al. |
| 2019/0189603 A1 | 6/2019 | Wang et al. |
| 2019/0391328 A1 | 12/2019 | Li et al. |
| 2020/0274321 A1* | 8/2020 | Ghegin ................ H01S 5/0421 |

OTHER PUBLICATIONS

Elodie Ghegin "Integration of Innovative Ohmic Contacts for Heterogeneous III-V/Silicon Photonic Devices" HAL Jan. 16, 2018. pp. 1-295.

* cited by examiner

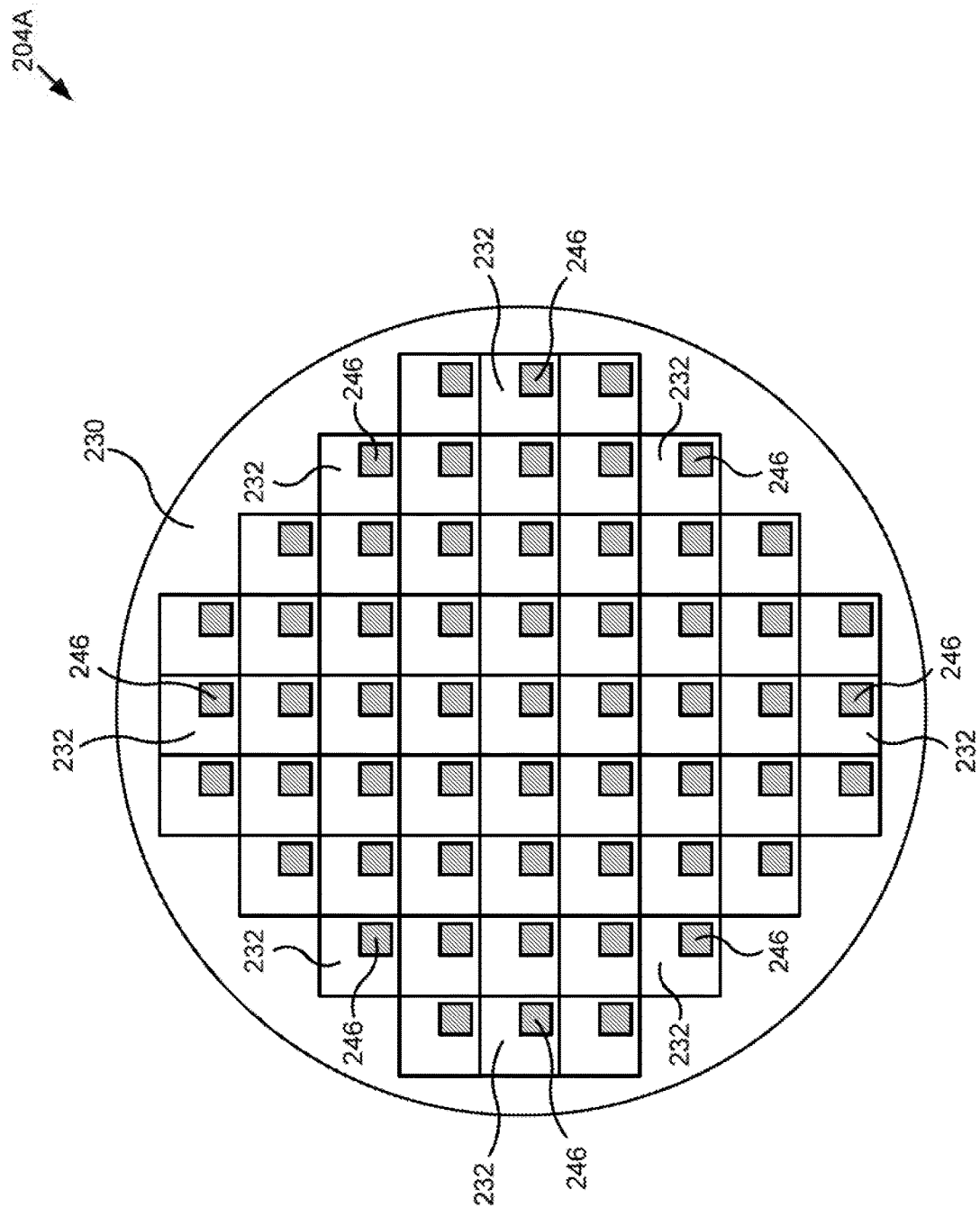

SEMICONDUCTOR STRUCTURE HAVING GROUP III-V DEVICE ON GROUP IV SUBSTRATE

CLAIMS OF PRIORITY

The present application is a continuation-in-part of and claims the benefit of and priority to application Ser. No. 16/740,173 filed on Jan. 10, 2020 and titled "Semiconductor Structure Having Group III-V Device on Group IV Substrate and Contacts with Precursor Stacks,". The present application is also continuation-in-part of and claims the benefit of and priority to application Ser. No. 16/741,565 filed on Jan. 13, 2020 and titled "Semiconductor Structure Having Group III-V Device on Group IV Substrate and Contacts with Liner Stacks,". The disclosures and contents of the above-identified applications are hereby incorporated fully by reference into the present application.

BACKGROUND

Group III-V compound semiconductors including at least one group III element, such as indium (In), gallium (Ga), aluminum (Al), and boron (B), and at least one group V element, such as arsenic (As), phosphorus (P), and nitrogen (N), have characteristics that make them advantageous for use in optical and optoelectronic devices. However, operations that are incidental to and supportive of these optical and optoelectronic devices, such as feedback, modulation, and input/output coupling, may be more easily implemented using group IV semiconductors, such as silicon.

In one approach, group III-V devices are formed separately from group IV devices, and then optically and/or electrically connected. However, inaccurate alignment of the group III-V devices could cause significant optical losses between the group III-V devices and the group IV devices. Optical losses can also increase as the separation between the group III-V devices and the group IV devices increases, for example, due to packaging or other intervening materials. Electrical connectors, such as wirebonds or solder balls, also generally increase electrical losses.

In another approach, group III-V devices are bonded to group IV devices. However, conventional techniques for forming contacts for group III-V devices employ lift-off of a metal layer, for example, a gold (Au) metal layer. These lift-off techniques leave residual materials that are difficult to clean. Gold also acts as a dopant to silicon and can have unintended consequences when integrating with group IV substrates. Moreover, group III-V devices can have extreme topographies, such as mesas having heights in excess of two microns (2 µm). These lift-off techniques result in contacts for group III-V devices being non-planar, significantly increasing the complexity of connecting the contacts to interconnect metals and vias, and often making the group III-V device incompatible with modern back-end-of-line (BEOL) multi-level metallization (MLM) schemes.

Thus, there is need in the art for efficiently and effectively integrating group III-V and group IV devices having reduced losses and complexity.

SUMMARY

The present disclosure is directed to a semiconductor structure having a group II-V device on a group IV substrate, substantially as shown in and/or described in connection with at least one of the figures, and as set forth in the claims.

BRIEF DESCRIPTION OF THE DRAWINGS

FIG. 3A illustrates a layout of a semiconductor structure processed in accordance with the flowchart of FIG. 1A according to one implementation of the present application.

DETAILED DESCRIPTION

Figure 1A:
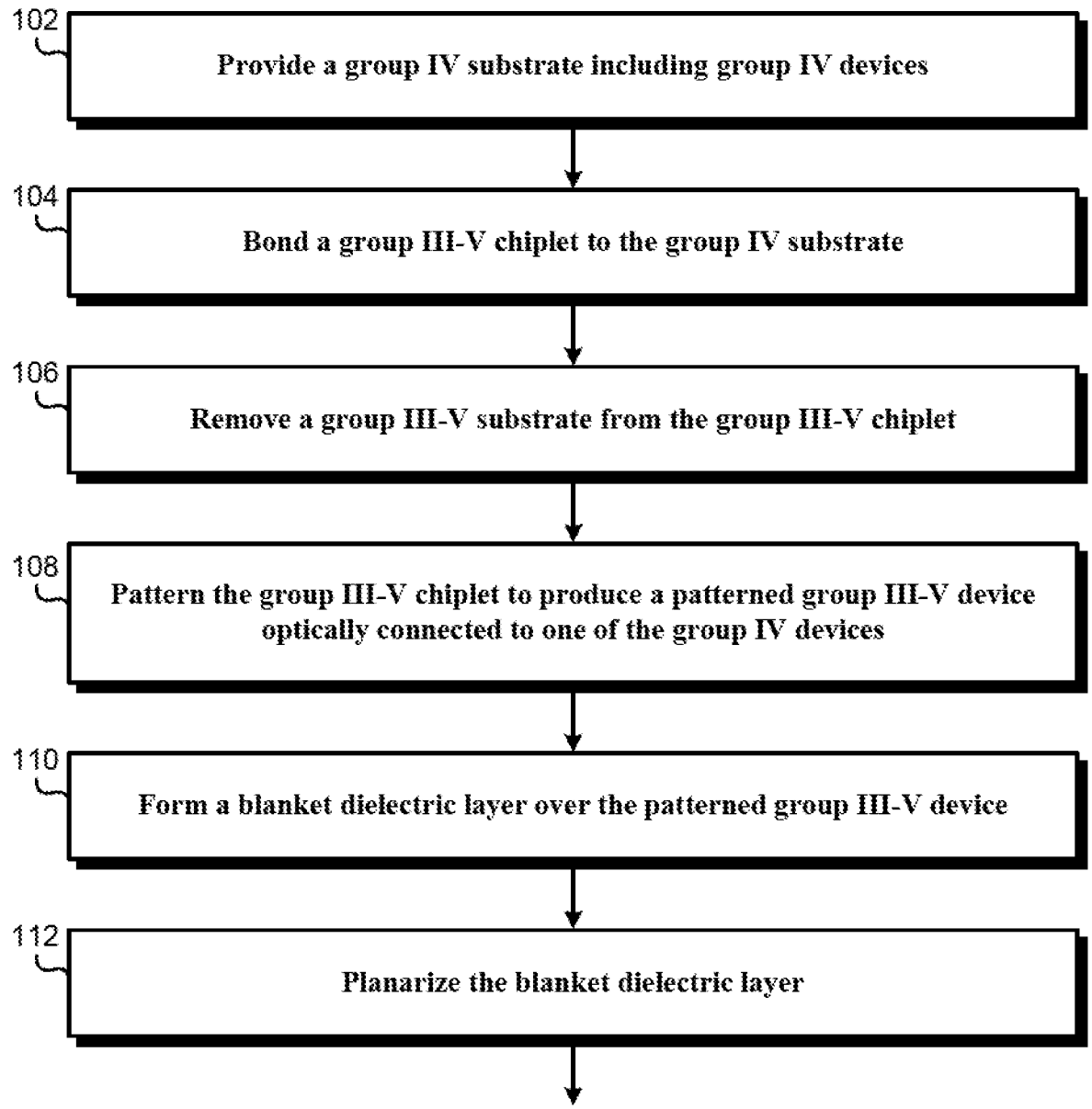
FIG. 1A illustrates a portion of a flowchart of an exemplary method for manufacturing a semiconductor structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2A:
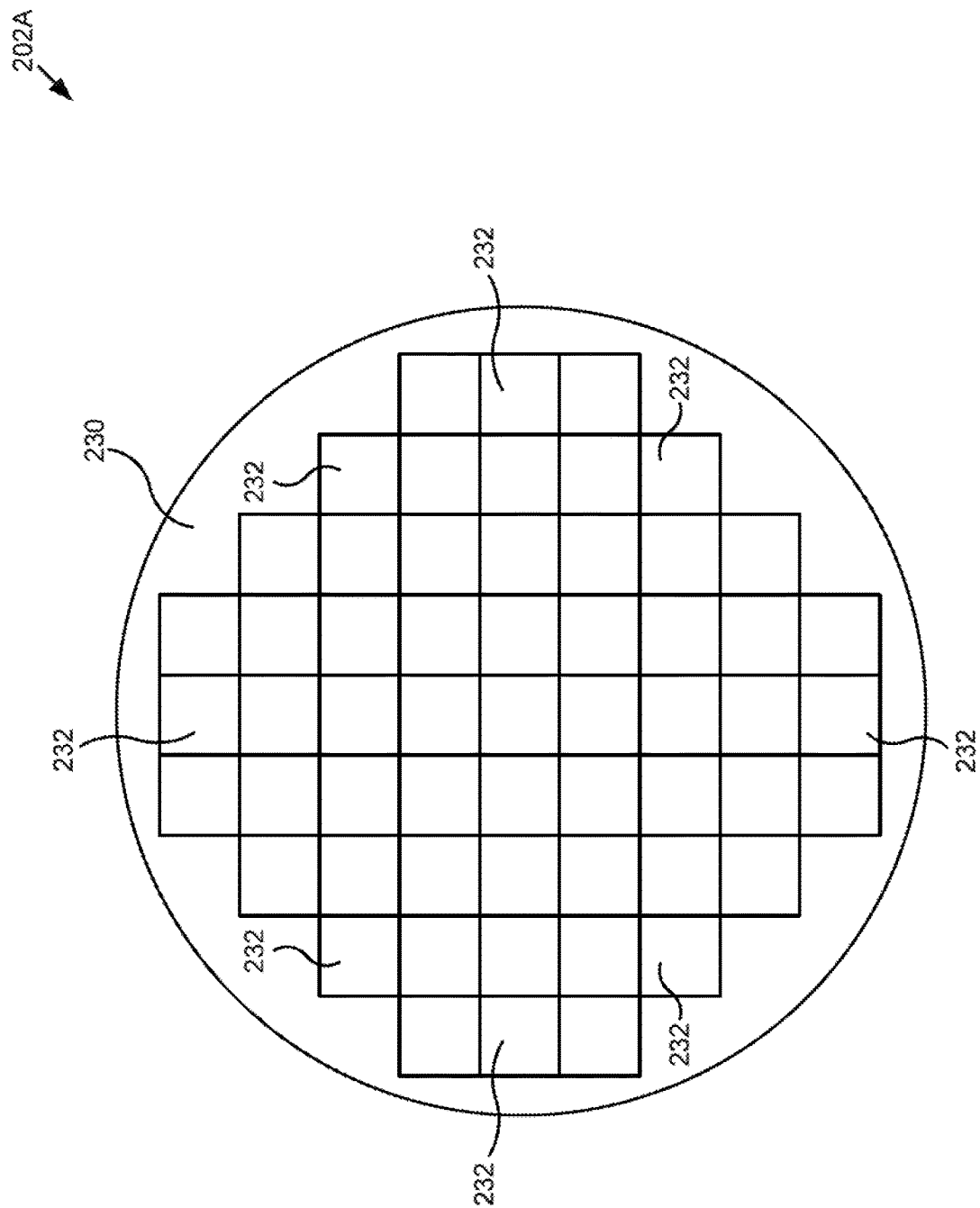
FIG. 2A illustrates a layout of a semiconductor structure processed in accordance with the flowchart of FIG. 1A according to one implementation of the present application.

FIG. 1A illustrates a portion of a flowchart of an exemplary method for manufacturing a semiconductor structure according to one implementation of the present application. Structures shown in FIGS. 2A through 7 illustrate the results of performing actions 102 through 112 shown in the flowchart of FIG. 1A. For example, FIG. 2A shows a semiconductor structure after performing action 102 in FIG. 1A, FIG. 3A shows a semiconductor structure after performing action 104 in FIG. 1A, FIG. 4 shows a semiconductor structure after performing action 106 in FIG. 1A, and so forth.

Figure 1B:
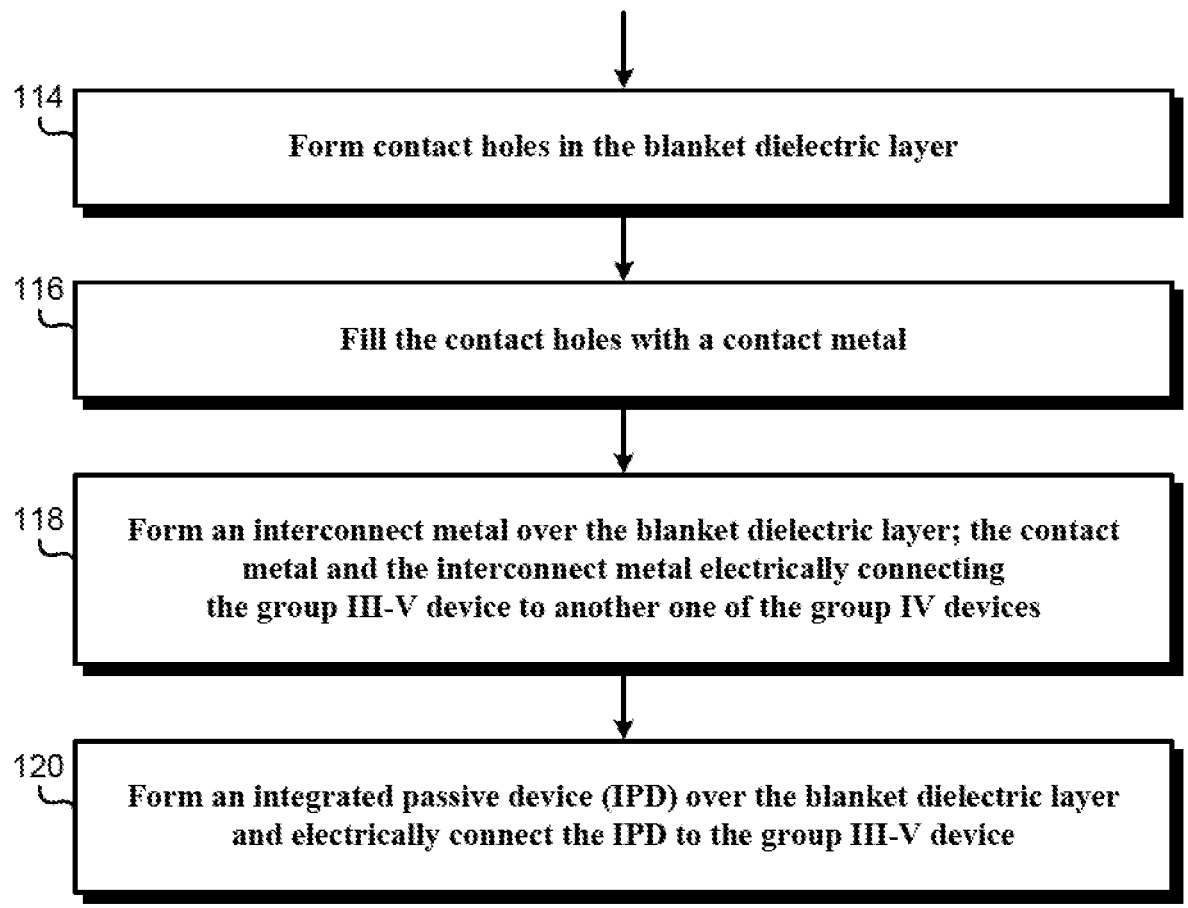
FIG. 1B illustrates a portion of a flowchart of an exemplary method for manufacturing a semiconductor structure, as a continuation to the flowchart of FIG. 1A, according to one implementation of the present application.
Figure 8:
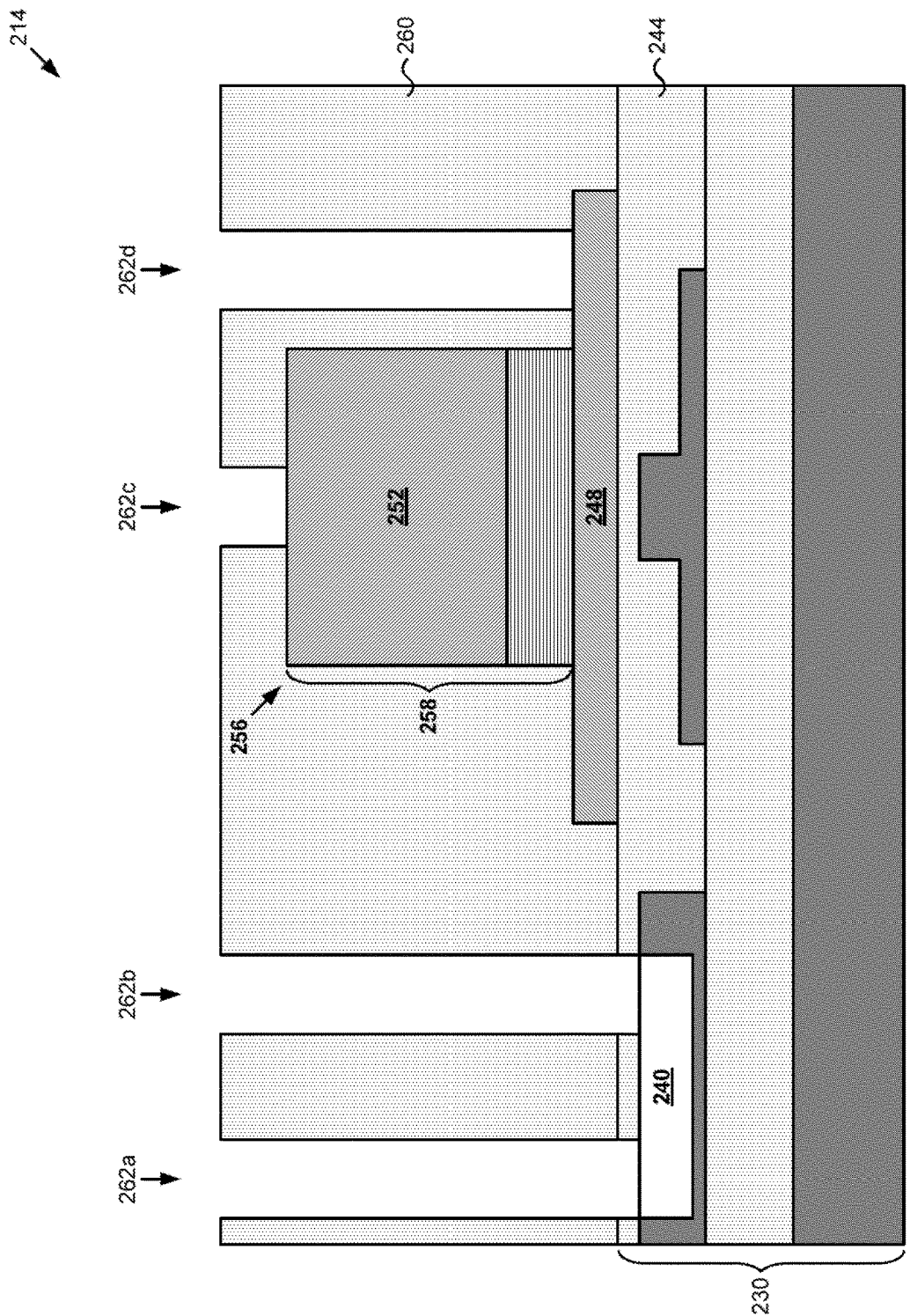
FIG. 8 illustrates a cross-sectional view of a portion of a semiconductor structure processed in accordance with the flowchart of FIG. 1B according to one implementation of the present application.
Figure 9:
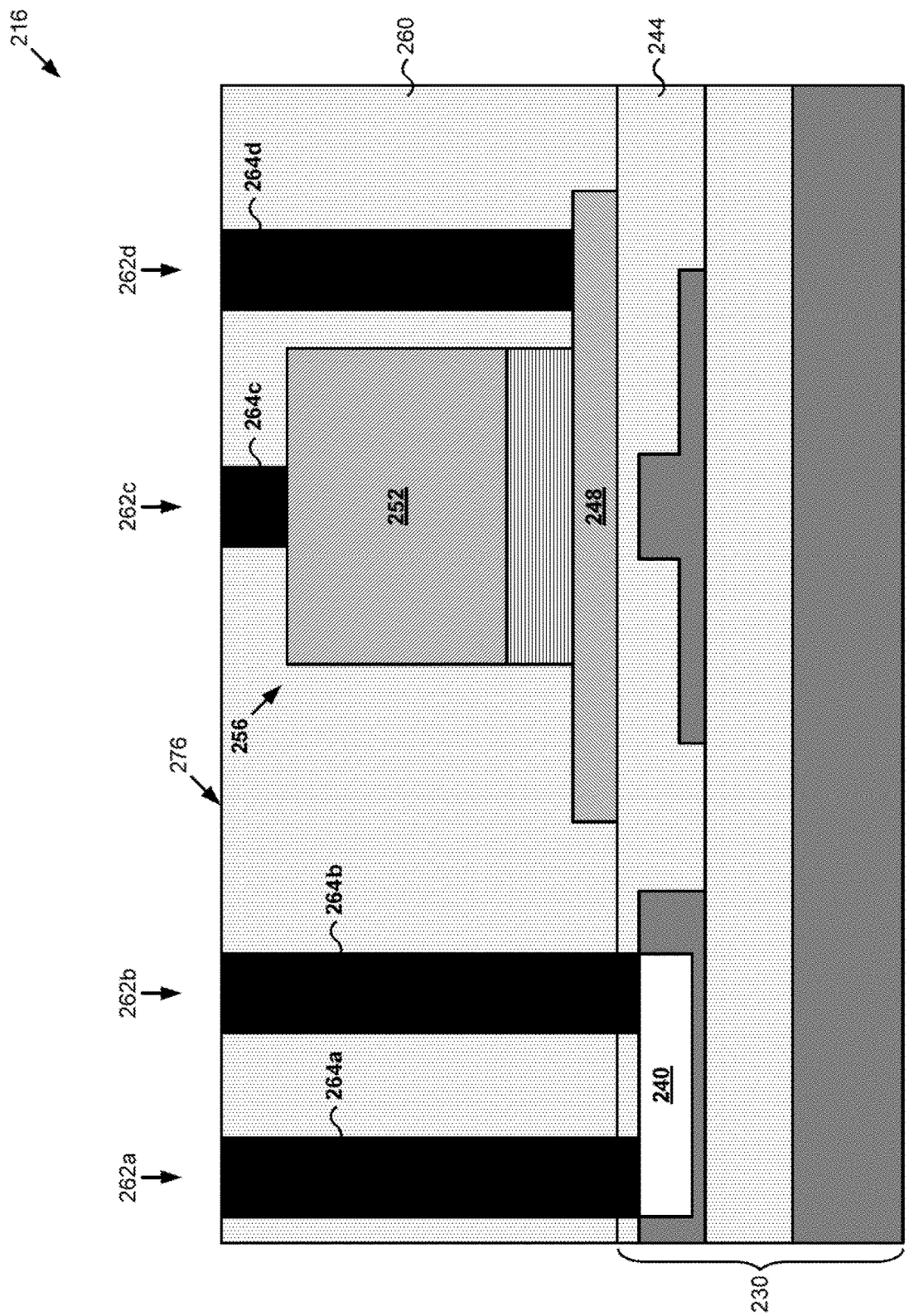
FIG. 9 illustrates a cross-sectional view of a portion of a semiconductor structure processed in accordance with the flowchart of FIG. 1B according to one implementation of the present application.

FIG. 1B illustrates a portion of a flowchart of an exemplary method for manufacturing a semiconductor structure, as a continuation to the flowchart of FIG. 1A, according to one implementation of the present application. Structures shown in FIGS. 8 through 11 illustrate the results of performing actions 114 through 120 shown in the flowchart of FIG. 1B. For example, FIG. 8 shows a semiconductor structure after performing action 114 in FIG. 1B, FIG. 9 shows a semiconductor structure after performing action 116 in FIG. 1B, and so forth.

Actions 102 through 120 shown in the flowcharts of FIGS. 1A and 1B are sufficient to describe one implementation of the present inventive concepts. Other implementations of the present inventive concepts may utilize actions different from those shown in the flowcharts of FIGS. 1A and 1B. Certain details and features have been left out of the flowcharts of FIGS. 1A and 1B that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 2A illustrates a layout of a semiconductor structure processed in accordance with action 102 in the flowchart of FIG. 1A according to one implementation of the present application. As shown in FIG. 2A, semiconductor structure 202A is provided. Semiconductor structure 202A includes group IV substrate 230 having multiple integrated circuits (ICs) 232. As used herein, the phrase "group IV" refers to a semiconductor material that includes at least one group IV element such as silicon (Si), germanium (Ge), and carbon (C), and may also include compound semiconductors such as silicon germanium (SiGe) and silicon carbide (SiC), for example. "Group IT" also refers to semiconductor materials that include more than one layer of group IV elements, or doping of group IV elements to produce strained group IV materials, and may also include group IV based composite substrates such as silicon on insulator (SOI) substrates, separation by implantation of oxygen (SIMOX) process substrates, and silicon on sapphire (SOS) substrates, for example. In one implementation, group IV substrate 230 is an SOI wafer having a diameter of approximately two hundred millimeters (200 mm).

In various implementations, group IV substrate 230 can include greater or fewer ICs 232 than those shown, by way of examples, on group IV substrate 230 of FIG. 2A. In the present implementation, ICs 232 have an approximately square shape. In one implementation, each of ICs 232 has dimensions of approximately twenty microns by approximately twenty microns (20 µm×20 µm). In various implementations, ICs 232 can have any other shapes and/or arrangements in group IV substrate 230. As described below, each of ICs 232 can include group IV devices (not shown in FIG. 2A).

Figure 2B:
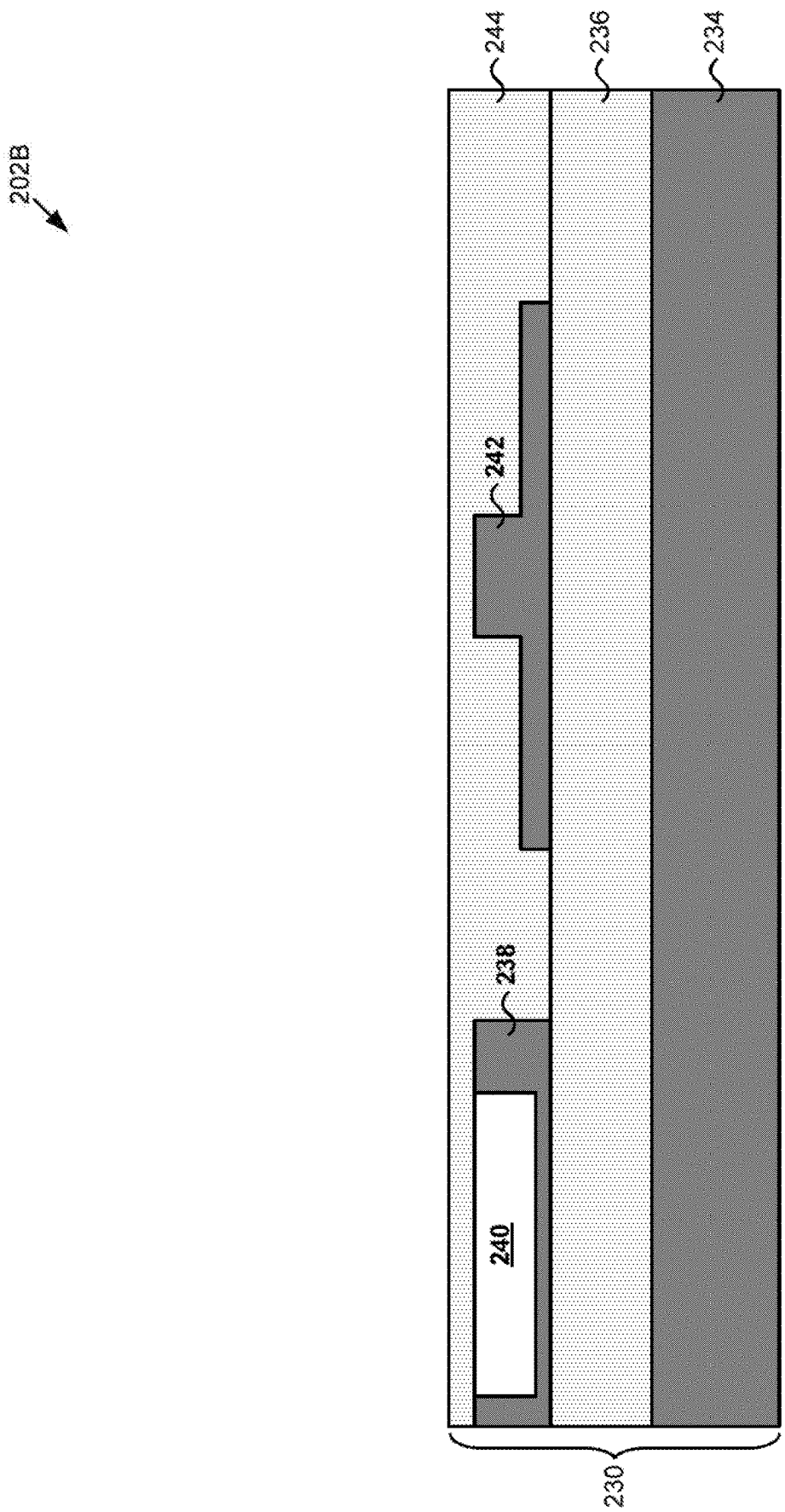
FIG. 2B illustrates a cross-sectional view of a portion of a semiconductor structure corresponding to FIG. 2A processed in accordance with the flowchart of FIG. 1A according to one implementation of the present application.

FIG. 2B illustrates a cross-sectional view of a portion of a semiconductor structure corresponding to FIG. 2A processed in accordance with action 102 in the flowchart of FIG. 1A according to one implementation of the present application. The cross-sectional view in FIG. 2B generally corresponds to a portion of one of ICs 232 in FIG. 2A. As shown in FIG. 2B, semiconductor structure 202B is provided. Semiconductor structure 202B includes group IV substrate 230. In the present implementation, group IV substrate 230 is an SOI substrate including handle wafer 234, buried oxide (BOX) 236, and top semiconductor 238. Group IV substrate also includes oxide layer 244 over top semiconductor 238.

In providing semiconductor structure 202B, a bonded and etch back SOI (BESOI) process can be used, as known in the art. In a BESOI process, handle wafer 234, BOX 236, and top semiconductor 238 together form an SOI substrate. Alternatively, as also known in the art, a SIMOX process (separation by implantation of oxygen process) or a "smart cut" process can also be used for providing semiconductor structure 202B. In a SIMOX process, handle wafer 234 can be a bulk silicon support wafer (which for ease of reference, may still be referred to as a "handle wafer" in the present application). Similar to a BESOI process, in both SIMOX and smart cut processes, handle wafer 234, BOX 236, and top semiconductor 238 together form an SOI substrate.

In one implementation, handle wafer 234 is undoped silicon. In various implementations, handle wafer 234 has a thickness of approximately seven hundred microns (700 µm) or greater or less. In one implementation, a trap rich layer can be situated between handle wafer 234 and BOX 236. In various implementations, BOX 236 typically comprises silicon dioxide ($SiO_2$), but it may also comprise silicon nitride ($Si_xN_y$), or another insulator material. In various implementations, BOX 236 has a thickness of approximately one micron (1 µm) or greater or less. In one implementation, top semiconductor 238 includes doped silicon. In various implementations, top semiconductor 238 has a thickness of approximately three hundred nanometers (300 nm) or greater or less. Handle wafer 234, BOX 236, and top semiconductor 238 can be provided together in group IV substrate 230 as a pre-fabricated SOI substrate. In various implementations, as discussed above, group IV substrate 230 may be any other group IV substrate.

Group IV substrate 230 includes group IV devices 240 and 242. In the present implementation, group IV device 240 is an electrical device, and group IV device 242 is an optical or optoelectronic device. In various implementations, group IV device 240 can be a transistor, an operational amplifier, a driver, a filter, a mixer, or a diode. In various implementations, group IV device 240 can be an active circuit comprising multiple active devices, or comprising passive devices in combination with at least one active device. In various implementations, group IV device 242 can be a waveguide, grating coupler, or an interferometer. In other implementations, group IV devices 240 and 242 can be any other types of group IV devices.

Group IV devices 240 and 242 are formed in top semiconductor 238. In semiconductor structure 202B, part of top semiconductor 238 is removed to isolate group IV device 240 from group IV device 242. In other implementations, dedicated isolation structures can be used. Other group IV devices (not shown in FIG. 2B) can be integrated in top semiconductor 238. Oxide layer 244 is situated over group IV devices 240 and 242 in group IV substrate 230. In various implementations, oxide layer 244 can comprise silicon oxide ($SiO_2$), silicon oxynitride ($Si_XO_YN_Z$), or another dielectric. In various implementations, the height of oxide layer 244 above group IV devices 240 and 242 can be approximately one hundred nanometers (100 nm).

FIG. 3A illustrates a layout of a semiconductor structure processed in accordance with action 104 in the flowchart of FIG. 1A according to one implementation of the present application. As shown in FIG. 3A, in semiconductor structure 204A, group III-V chiplets 246 are bonded to group IV substrate 230.

Group III-V chiplets 246 are unpatterned dies including group III-V semiconductors. As used herein, the phrase "group III-V" refers to a compound semiconductor including at least one group III element, such as indium (In), gallium (Ga), aluminum (Al), and boron (B), and at least one group V element, such as arsenic (As), phosphorus (P), and nitrogen (N). By way of example, a group III-V semiconductor may take the form of indium phosphide (InP). "Group III-V" can also refer to a compound semiconductor that includes an alloy of a group II element and/or an alloy of a group V element, such as indium gallium arsenide ($In_XGa_{1-X}As$), indium gallium nitride ($In_XGa_{1-X}N$), aluminum gallium nitride ($Al_XGa_{1-X}N$), aluminum indium gallium nitride ($Al_XIn_YGa_{1-X-Y}N$), gallium arsenide phosphide nitride ($GaAs_AP_BN_{1-A-B}$), and aluminum indium gallium arsenide phosphide nitride ($Al_XIn_YGa_{1-X-Y}As_AP_BN_{1-A-B}$), for example. "Group III-V" also refers generally to any polarity including but not limited to Ga-polar, N-polar, semi-polar, or non-polar crystal orientations. A group III-V material may also include either the Wurtzitic, Zincblende, or mixed polytypes, and may include single-crystal, monocrystalline, polycrystalline, or amorphous structures.

As described below, group III-V chiplets 246 can be provided by growing multiple epitaxial layers on a group III-V substrate, and then dicing the group III-V substrate and the epitaxial layers into group III-V chiplets 246. In one implementation, group III-V chiplets 246 can be formed from an InP wafer having a diameter of approximately one hundred millimeters (100 mm). In the present implementation, one of group III-V chiplets 246 is bonded to each IC 232. In other implementations, more or fewer group III-V chiplets 246 can be bonded to each IC 232.

Figure 3B:
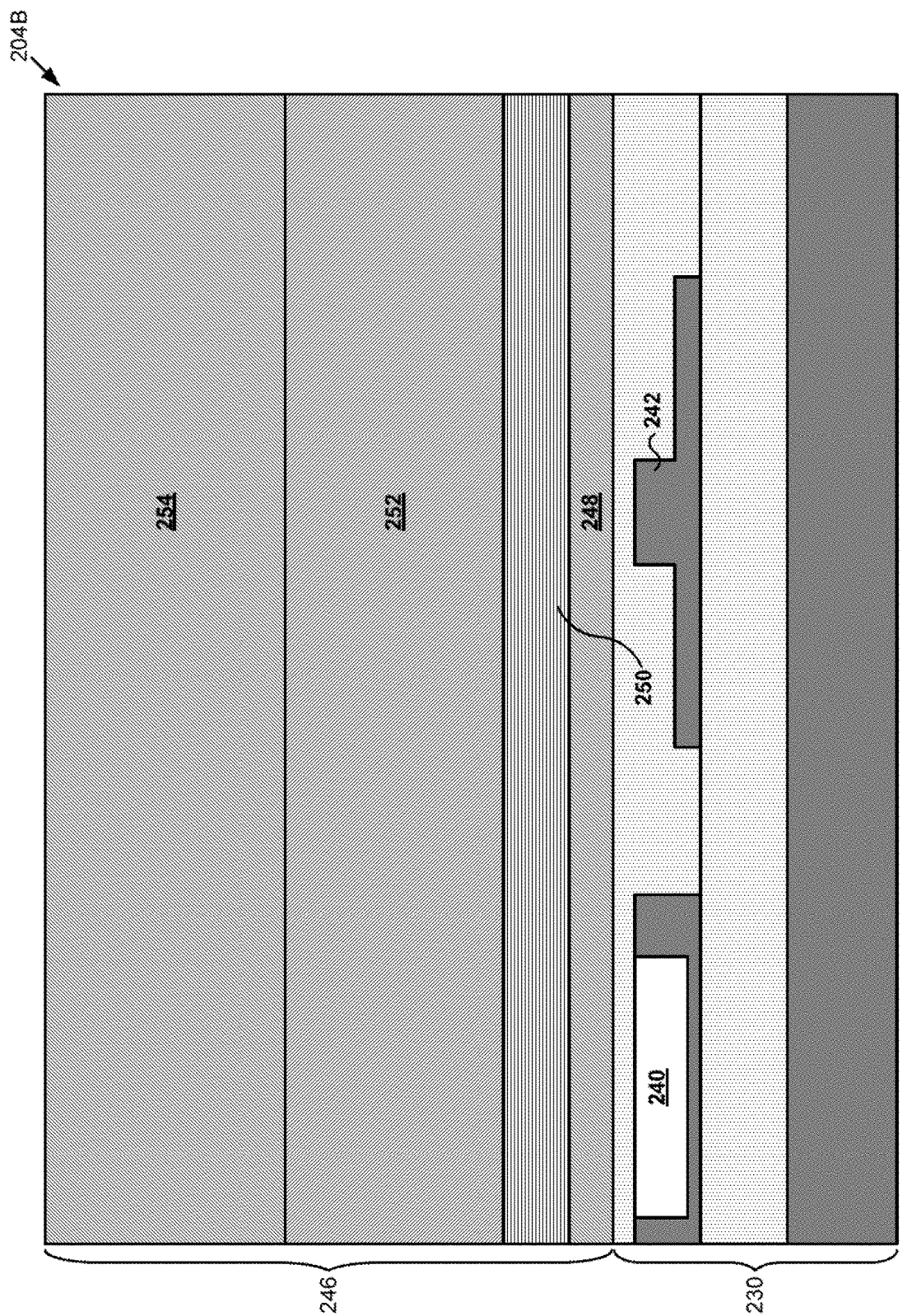
FIG. 3B illustrates a cross-sectional view of a portion of a semiconductor structure corresponding to FIG. 3A processed in accordance with the flowchart of FIG. 1A according to one implementation of the present application.
Figure 4:
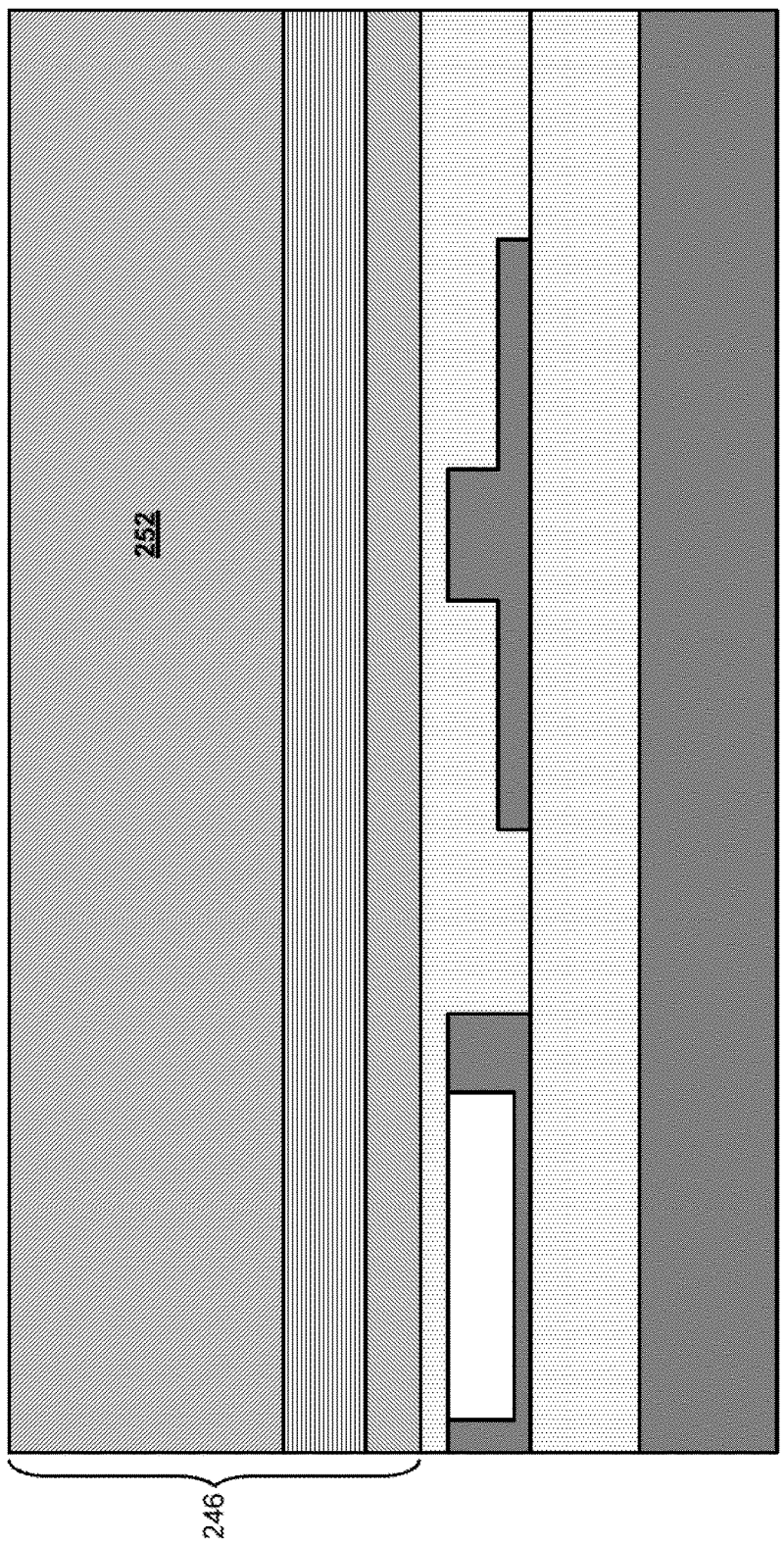
FIG. 4 illustrates a cross-sectional view of a portion of a semiconductor structure processed in accordance with the flowchart of FIG. 1A according to one implementation of the present application.

FIG. 3B illustrates a cross-sectional view of a portion of a semiconductor structure corresponding to FIG. 3A processed in accordance with action 104 in the flowchart of FIG. 1A according to one implementation of the present application. The cross-sectional view in FIG. 3B generally corresponds to a portion of one of ICs 232 in FIG. 3A. As shown in FIG. 3B, in semiconductor structure 204B, group III-V chiplet 246 is bonded to group IV substrate 230.

Group III-V chiplet 246 includes doped group III-V layer 248, transition layers 250, doped group III-V layer 252, and group III-V substrate 254. Prior to bonding to group IV substrate 230, group III-V chiplet 246 can be fabricated by sequential epitaxial growth of doped group III-V layer 252, transition layers 250, and doped group III-V layer 248 on group III-V substrate 254. In various implementations, group III-V substrate 254 can be an InP substrate having a thickness of approximately two hundred microns (200 μm) or greater or less.

In one implementation, doped group III-V layer 252 is implanted with boron or another appropriate P type dopant. For example, doped group III-V layer 252 can comprise P type InGaAs having a thickness of approximately two microns (2 μm) or greater or less. As known in the art, doped group III-V layer 252 can comprise a thin heavily doped contact layer near group III-V substrate 254 and a thick lightly doped cladding layer near transition layers 250.

Transition layers 250 comprise a series of group III-V layers functioning as quantum wells to provide optical gain. For example, transition layers 250 can comprise several undoped InGaAsP layers each having a thickness of approximately ten nanometers (10 nm). As known in the art, transition layers 250 can also comprise confinement layers around the quantum wells and having lower refractive index. In one implementation, transition layers 250 can have a combined thickness of approximately two hundred nanometers (200 nm).

Doped group III-V layer 248 is a group III-V layer having an opposite doping type than doped group III-V layer 252. In one implementation, doped group III-V layer 248 is implanted with phosphorus or another appropriate N type dopant. For example, doped group III-V layer 248 can comprise N type InP having a thickness of approximately one hundred nanometers (100 nm) or greater or less.

Group III-V chiplet 246 can be bonded to group IV substrate 230 by oxygen plasma assisted direct wafer bonding. The surfaces of group III-V chiplet 246 and group IV substrate 230 can be cleaned, then activated by an oxygen plasma, then placed in physical contact at room temperature to bond. In one implementation, after bonding, a low-temperature anneal can also be performed. For example, semiconductor structure 204B can be annealed at a temperature of approximately three hundred degrees Celsius (300° C.).

In semiconductor structure 204B, doped group III-V layer 252, transition layers 250, and doped group III-V layer 248 form a P-I-N junction. Thus, group III-V chiplet 246 represents an unpatterned III-V die, suitable for patterning into an optoelectronic device, such as a laser or photodiode. Although an example of N type doped group III-V layer 248 and P type doped group III-V layer 252 is described above, in one implementation, the dopant types can be switched (i.e., P type doped group III-V layer 248 and N type doped group III-V layer 252). In other implementations, group III-V chiplet 246 can have other layering suitable for other devices. In other implementations, some patterning may be performed prior to bonding. In semiconductor structure 204B, group III-V chiplet 246 is shown to overlie both group IV devices 242 and 240. In other implementations, group III-V chiplet 246 may overlie more or fewer group IV devices of group IV substrate 230. For example, group IV device 240 can be situated in an area of IC 232 (shown in FIG. 3A) that does not underlie group III-V chiplet 246.

FIG. 4 illustrates a cross-sectional view of a portion of a semiconductor structure processed in accordance with action 106 in the flowchart of FIG. 1A according to one implementation of the present application. As shown in FIG. 4, in semiconductor structure 206, group III-V substrate 254 (shown in FIG. 3B) is removed from group II-V chiplet 246.

Group III-V substrate 254 (shown in FIG. 3B) can be removed using any means known in the art. For example, group III-V substrate 254 (shown in FIG. 3B) can be removed by grinding and/or chemical mechanical polishing (CMP), followed by wet etching using hydrogen chloride (HCl) mixture. In various implementations, group III-V substrate 254 (shown in FIG. 3B) can be selectively etched while doped group III-V layer 252 or another sacrificial layer performs as an etch stop.

Figure 5:
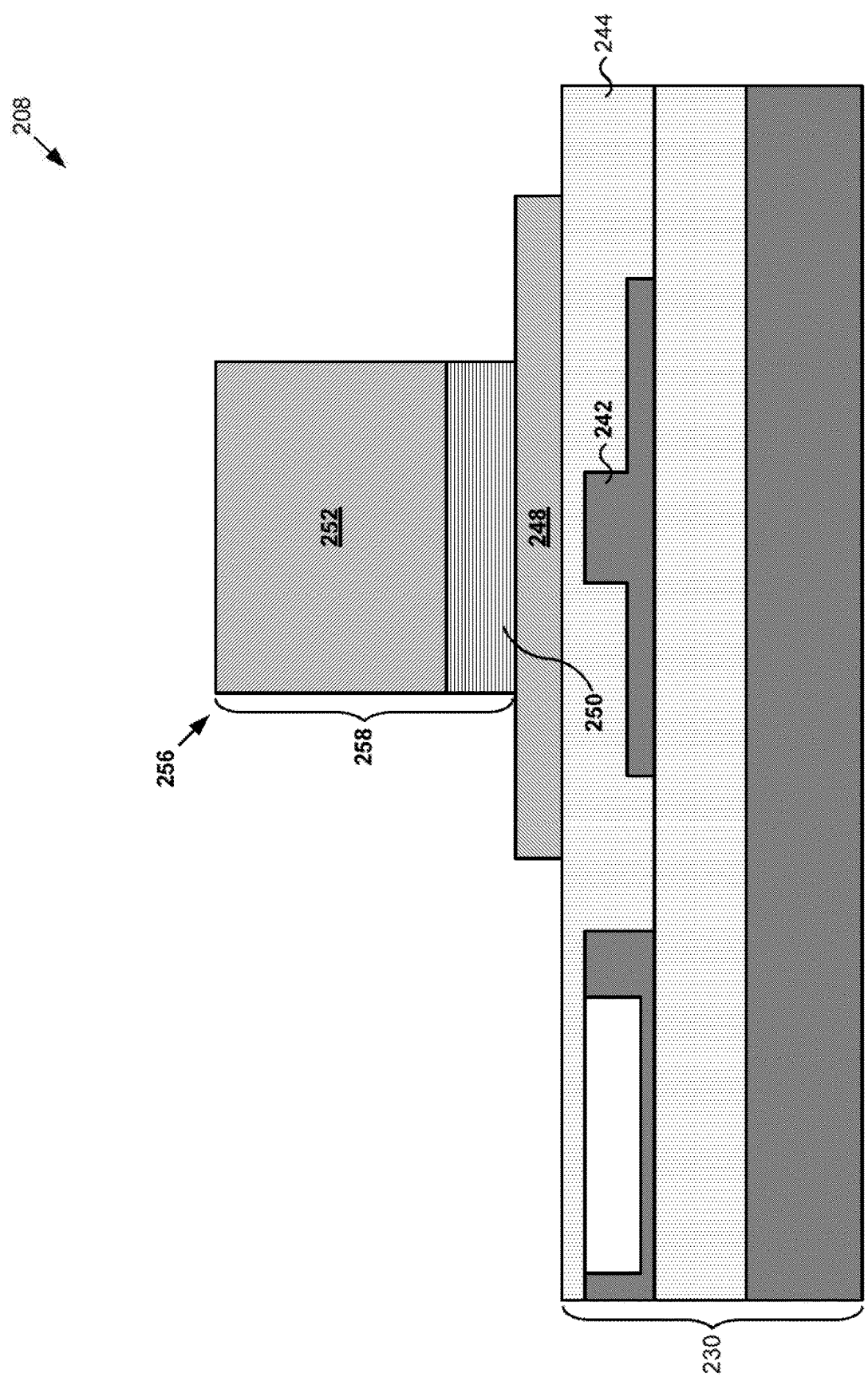
FIG. 5 illustrates a cross-sectional view of a portion of a semiconductor structure processed in accordance with the flowchart of FIG. 1A according to one implementation of the present application.

FIG. 5 illustrates a cross-sectional view of a portion of a semiconductor structure processed in accordance with action 108 in the flowchart of FIG. 1A according to one implementation of the present application. As shown in FIG. 5, in semiconductor structure 208, group III-V chiplet 246 (shown in FIG. 4) is patterned to produce patterned group III-V device 256.

Patterned group III-V device 256 can be formed by depositing and patterning a hardmask, for example a $Si_XN_Y$ hardmask, over doped group III-V layer 252, then etching doped group III-V layer 252 using a phosphorus (P) based wet etch. In this implementation, doped group III-V layer 252 may be selectively etched while transition layers 250 perform as an etch stop. Then transition layers 250 can be etched, for example, using a reactive ion etch (RIE). Finally, doped group III-V layer 248 can be etched, for example, by patterning another mask and using a bromine (Br) based wet etch.

Patterned group III-V device 256 can be an optoelectronic device, such as a laser or photodiode. As shown in FIG. 5, after forming patterned group III-V device 256, group III-V mesa 258 is situated over doped group III-V layer 248. Group III-V mesa 258 includes transition layers 250 and doped group III-V layer 252. In order for patterned group III-V device 256 to avoid significant optical losses, in various implementations, a height of group III-V mesa 258 may be approximately two microns (2 μm) or greater.

Patterned group III-V device 256 is optically connected to group IV device 242 in group IV substrate 230. Patterned group III-V device 256 is approximately aligned with group IV device 242. Patterned group III-V device 256 is separated from group IV device 242 by a thin portion of oxide layer 244 that was used to protect group IV devices 240 and 242 during bonding action 104 (shown in FIG. 3B). As described above, in various implementations, group IV device 242 can be a waveguide, grating coupler, or an interferometer. In one implementation, group IV device 242 may couple light to/from patterned group III-V device 256 from/to another plane not visible in the cross-sectional view of FIG. 5. In another implementation, group IV device 242 may couple light to/from patterned group III-V device 256 from/to a bottom of group IV substrate 230. In various implementations, patterned group III-V device 256 can be optically connected to additional group IV devices (not shown in FIG. 5) in group IV substrate 230.

Similarly, group IV device 242 can be optically connected to additional group IV devices (not shown in FIG. 5) in group IV substrate 230 and/or to an optical input/output interface (not shown in FIG. 5).

Figure 6:
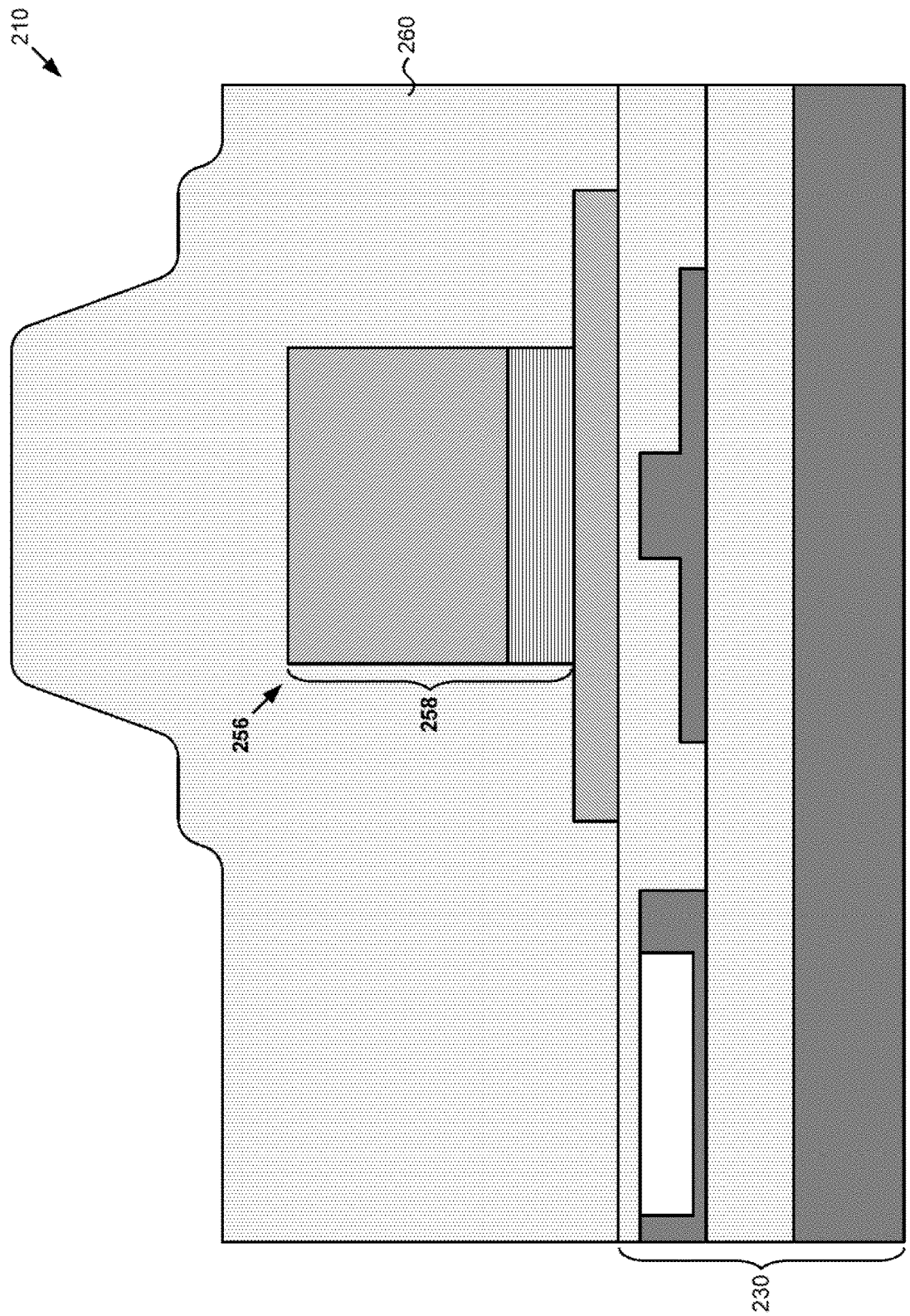
FIG. 6 illustrates a cross-sectional view of a portion of a semiconductor structure processed in accordance with the flowchart of FIG. 1A according to one implementation of the present application.

FIG. 6 illustrates a cross-sectional view of a portion of a semiconductor structure processed in accordance with action 110 in the flowchart of FIG. 1A according to one implementation of the present application. As shown in FIG. 6, in semiconductor structure 210, blanket dielectric layer 260 is formed over patterned group III-V device 256 and over portions of group IV substrate 230.

In the present implementation blanket dielectric layer 260 is $SiO_2$ formed by high density plasma chemical vapor deposition (HDP-CVD). In various implementations, blanket dielectric layer 260 is $Si_XN_Y$ or another dielectric. In various implementations, blanket dielectric layer 260 can be formed, for example, by plasma enhanced CVD (PECVD). Notably, although the exact topography of blanket dielectric layer 260 will depend on the formation process used, the topography of blanket dielectric layer 260 generally mirrors that of patterned group III-V device 256. In particular, blanket dielectric layer 260 protrudes in a region above group III-V mesa 258 of group III-V device 256. In order to ensure that blanket dielectric layer 260 covers group III-V mesa 258, in one implementation, a deposition thickness of blanket dielectric layer 260 can be significantly greater than a height of group III-V mesa 258. For example, the deposition thickness of blanket dielectric layer 260 can be approximately three microns (3 μm) or greater.

Figure 7:
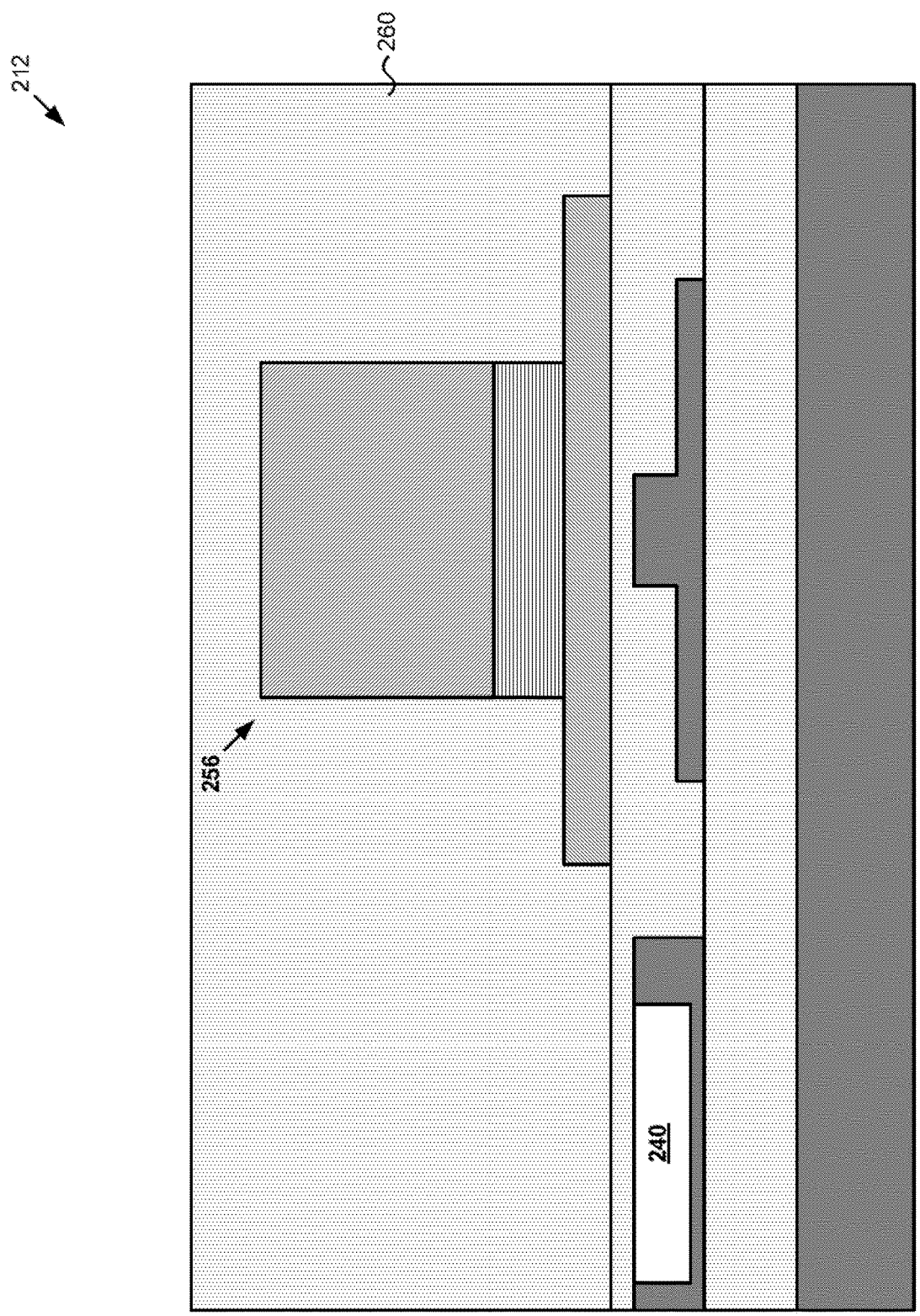
FIG. 7 illustrates a cross-sectional view of a portion of a semiconductor structure processed in accordance with the flowchart of FIG. 1A according to one implementation of the present application.

FIG. 7 illustrates a cross-sectional view of a portion of a semiconductor structure processed in accordance with action 112 the flowchart of FIG. 1A according to one implementation of the present application. As shown in FIG. 7, in semiconductor structure 212, blanket dielectric layer 260 is planarized.

In one implementation, CMP is utilized to planarize blanket dielectric layer 260. The CMP can utilize a slurry consisting of fine abrasive particles dispersed in an acidic or basic aqueous solution. In various implementation, the abrasive particles can comprise fumed silica, colloidal silica, or ceria. In various implementations, the slurry can comprise various active chemicals, such as oxidizers, pH stabilizers, and/or corrosion inhibitors.

Planarizing blanket dielectric layer 260 as shown in FIG. 7 allows subsequent masks, subsequent etches, and subsequent metal formations to be performed with more reliable alignment, and allows other planar layers to be deposited above semiconductor structure 212. In particular, planarizing blanket dielectric layer 260 enables use of a damascene technique, as described below. It is noted that, while action 112 results in blanket dielectric layer 260 being substantially planar, blanket dielectric layer 260 may not necessarily have uniform thickness along semiconductor structure 212. For example, due to normal process variations associated with planarization, a thickness of blanket dielectric layer 260 overlying group IV device 240 can be greater than a thickness of blanket dielectric layer 260 overlying patterned group I-v device 256.

FIG. 8 illustrates a cross-sectional view of a portion of a semiconductor structure processed in accordance with action 114 in the flowchart of FIG. 1B according to one implementation of the present application. As shown in FIG. 8, in semiconductor structure 214, contact holes 262a, 262b, 262c, and 262d are formed in blanket dielectric layer 260.

Contact holes 262a and 262b extend through blanket dielectric layer 260, and through a portion of oxide layer 244, to group IV device 240. Where group IV device 240 is, for example, a transistor, contact holes 262a and 262b can be situated over a drain/source and a gate of group IV device 240. Where group IV device 240 is, for example, an operational amplifier, contact holes 262a and 262b can be situated over an input terminal and an output terminal of group IV device 240.

Contact hole 262c extends through a portion of blanket dielectric layer 260 to doped group III-V layer 252 of patterned group III-V device 256. Contact hole 262d extends through a portion of blanket dielectric layer 260 to doped group III-V layer 248 of patterned group III-V device 256. Where patterned group III-V device 256 is, for example, a photodiode, contact holes 262c and 262d can be situated, respectively, over an anode and a cathode of patterned group III-V device 256.

Contact holes 262a, 262b, 262c, and 262d can be formed, for example, by using photolithography to define a mask over blanket dielectric layer 260 having exposed portions corresponding to contact holes 262a, 262b, 262c, and 262d, then etching the exposed portions of blanket dielectric layer 260 using a fluorine-based plasma dry etch. Notably, formation of contact holes 262a, 262b, 262c, and 262d is simplified because blanket dielectric layer 260 is substantially planar. For example, if a non-planar conformal dielectric layer were situated over patterned group III-V device

256, due to the height of group III-V mesa 258, the dielectric layer would have steep topography between doped group III-V layer 248 and doped group III-V layer 252. This steep topography could make it difficult to accurately define an overlying mask to have an exposed region corresponding to contact hole 262d. In contrast, because blanket dielectric layer 260 in semiconductor structure 214 is substantially planar, contact hole 262d can be formed adjacent to group III-V mesa 258 and over doped group III-V layer 248 with relatively high accuracy.

In various implementations, etch stop layers (not shown in FIG. 8) can be situated over group IV device 240 and/or over patterned group III-V device 256, and forming contact holes 262a, 262b, 262c, and 262d can comprise two different etching actions. For example, when group IV substrate 230 is provided as shown in FIG. 2B, a nitride etch stop layer may be situated over group IV device 240. As another example, after forming patterned group III-V device 256 as shown in FIG. 5, a nitride etch stop layer can be deposited and patterned over patterned group III-V device 256.

Referring back to FIG. 8, a first etching action can be performed, for example, using a fluorine-based plasma dry etch, to selectively etch blanket dielectric layer 260 and oxide layer 244 down to the etch stop layers (not shown in FIG. 8) situated over group IV device 240 and/or over patterned group III-V device 256. Blanket dielectric layer 260 and oxide layer 244 can be aggressively etched during this first etching action without etching group IV device 240 and/or patterned group III-V device 256. Then a second etching action can be performed, for example, using a chlorine-based plasma dry etch, in order to remove the etch stop layers (not shown in FIG. 8). This second etching action can be a short etching action that can be accurately timed to stop at the top surfaces of group IV device 240 and patterned group III-V device 256, with minimal or substantially no etching of group IV device 240 and patterned group III-V device 256.

In one implementation, because contact hole 262c is significantly shallower than contact holes 262a, 262b, and 262d due to the height of group III-V mesa 258, an additional etch protection can be utilized for doped group III-V layer 252 compared to doped group III-V layer 248 and/or group IV device 240. For example, thicker and/or additional etch stop layers may be situated over doped group III-V layer 252. As another example, an etch stop layer may be situated over doped group III-V layer 252, while no etch stop layers are used over doped group III-V layer 248 and/or group IV device 240.

FIG. 9 illustrates a cross-sectional view of a portion of a semiconductor structure processed in accordance with action 116 in the flowchart of FIG. 1B according to one implementation of the present application. As shown in FIG. 9, in semiconductor structure 216, contact holes 262a, 262b, 262c, and 262d are filled with contact metals 264a, 264b, 264c, and 264d respectively.

Contact metals 264a and 264b extend through blanket dielectric layer 260 and a portion of oxide layer 244 and connect to group IV device 240 in group IV substrate 230. Contact metal 264c extends through a portion of blanket dielectric layer 260 and connects to doped group III-V layer 252 of patterned group III-V device 256. Contact metal 264d extends through a portion of blanket dielectric layer 260 and connects to doped group III-V layer 248 of patterned group III-V device 256.

Because blanket dielectric layer is situated over patterned group III-V device 256 and substantially planar, contact holes 262a, 262b, and 262d have relatively high aspect ratios compared to contact hole 262c. Techniques with poor step coverage, such as physical vapor deposition (PVD) as part of a lift-off technique or a metal etch technique, may be unsuitable for forming contact metals 264a, 264b, and 264d in contact holes 262a, 262b, and 262d. In the present implementation, a damascene technique is used to form contact metals 264a, 264b, 264c, and 264d. A thin metal seed layer is deposited in contact holes 262a, 262b, 262c, and 262d and over blanket dielectric layer 260, for example, using PVD. Next, contact holes 262a, 262b, 262c, and 262d are filled with a contact metal using electrodeposition. Then, the contact metal is planarized with top surface 276 of blanket dielectric layer 260, for example, using CMP, thereby forming contact metals 264a, 264b, 264c, and 264d. The CMP can utilize a slurry consisting of fine abrasive particles, such as colloidal silica or colloidal alumina, dispersed in a basic aqueous solution. The damascene technique provides good step coverage and filling of contact holes 262a, 262b, 262c, and 262d, while maintaining planarity at top surface 276.

In an alternative implementation, a contact metal is deposited in contacts holes 262a, 262b, 262c, and 262d and over blanket dielectric layer 260, for example, using CVD, and then planarized with top surface 276 of blanket dielectric layer 260, for example, using CMP, thereby forming thereby forming contact metals 264a, 264b, 264c, and 264d. The CMP can utilize a slurry consisting of fine abrasive particles, such as fumed silica or fumed alumina, dispersed in a basic aqueous solution. In various implementations, contact metals 264a, 264b, 264c, and 264d can comprise tungsten (W), aluminum (Al), or copper (Cu).

Figure 10:
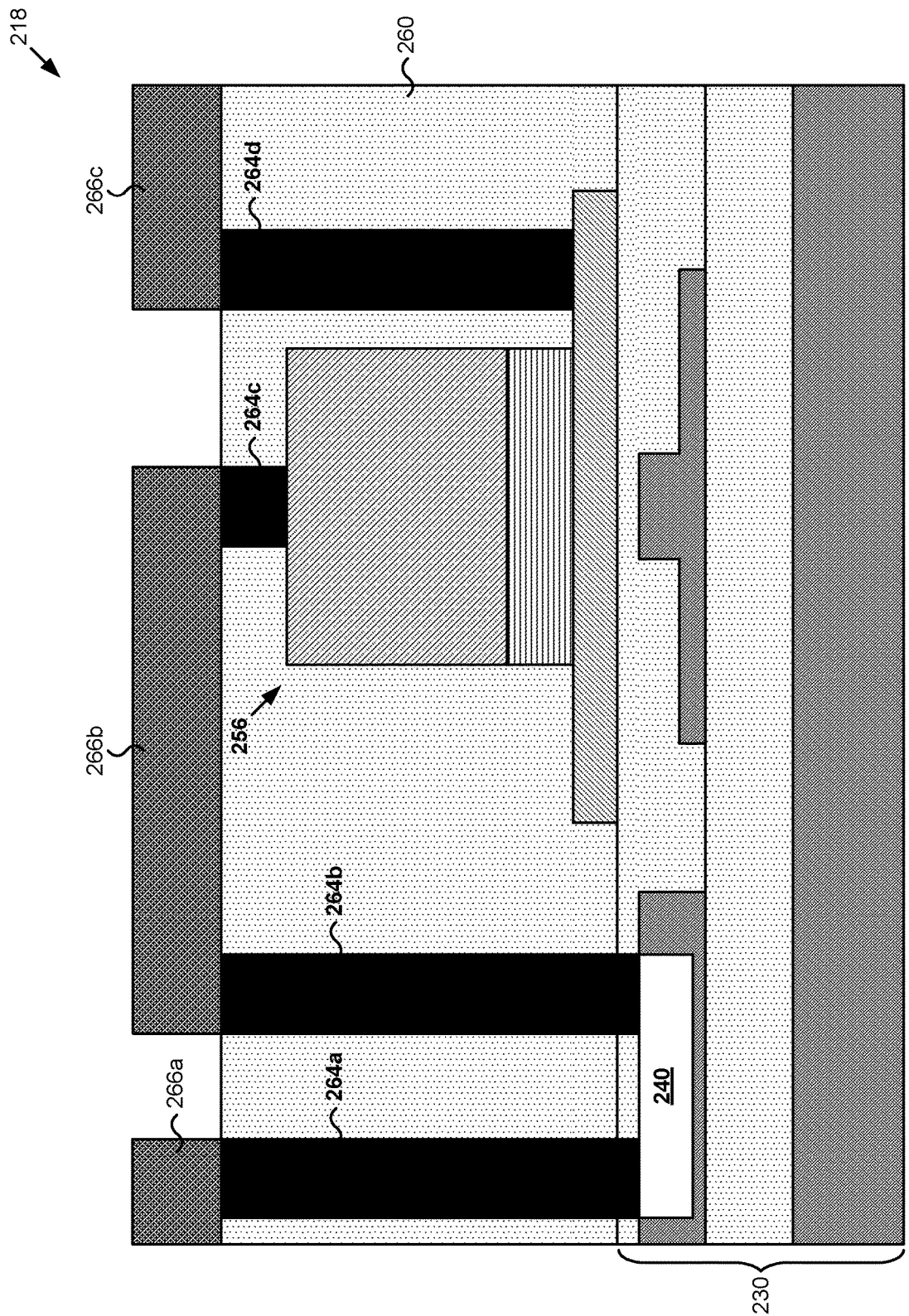
FIG. 10 illustrates a cross-sectional view of a portion of a semiconductor structure processed in accordance with the flowchart of FIG. 1B according to one implementation of the present application.

FIG. 10 illustrates a cross-sectional view of a portion of a semiconductor structure processed in accordance with action 118 in the flowchart of FIG. 1B according to one implementation of the present application. As shown in FIG. 10, in semiconductor structure 218, interconnect metals 266a, 266b, and 266c are formed over blanket dielectric layer 260 and over contact metals 264a, 264b, 264c, and 264d.

Interconnect metal 266a is situated over contact metal 264a and over blanket dielectric layer 260. Interconnect metal 266b is situated over contact metals 264b and 264c and over blanket dielectric layer 260. In particular, a first end of interconnect metal 266b is situated over contact metal 264b and a second end of interconnect metal 266b is situated over contact metal 264c. Interconnect metal 266c is situated over contact metal 264d and over blanket dielectric layer 260.

In one implementation, a metal layer is deposited over blanket dielectric layer 260 and over contact metals 264a, 264b, 264c, and 264d, and then segments thereof are etched, thereby forming interconnect metals 266a, 266b, and 266c. In an alternative implementation, a damascene technique is used to form interconnect metals 266a, 266b, and 266c. In various implementations, interconnect metals 266a, 266b, and 266c can comprise W, Al, or Cu. Although contact metals 264a, 264b, 264c, and 264d and interconnect metals 266a, 266b, and 266c are separate formations in FIG. 10, in other implementations they may be parts of the same formation, for example, formed using a dual damascene technique.

In semiconductor structure 218, contact metals 264a, 264b, 264c, and 264d and interconnect metals 266a, 266b, and 266c are electrically connected to patterned group III-V device 256 and group IV device 240. In particular, contact metal 264c, interconnect metal 266b, and contact metal 264b create a direct path electrically connecting patterned group III-V device 256 over group IV substrate 230 to group IV device 240 in group IV substrate 230. Where patterned group III-V device 256 is, for example, a photodiode, group IV device 240 can be part of a readout circuit for patterned group III-V device 256. Where patterned group III-V device 256 is, for example, a laser, group IV device 240 can be part of a driver circuit for patterned group III-V device 256. Interconnect metal 266a can electrically connect group IV device 240 to other structures (not shown in FIG. 10). Similarly, interconnect metal 266c can electrically connect patterned group III-V device 256 to other structures (not shown in FIG. 10). As described below, interconnect metals 266a, 266b, and 266c facilitate additional connections to higher metallization levels.

Figure 11:
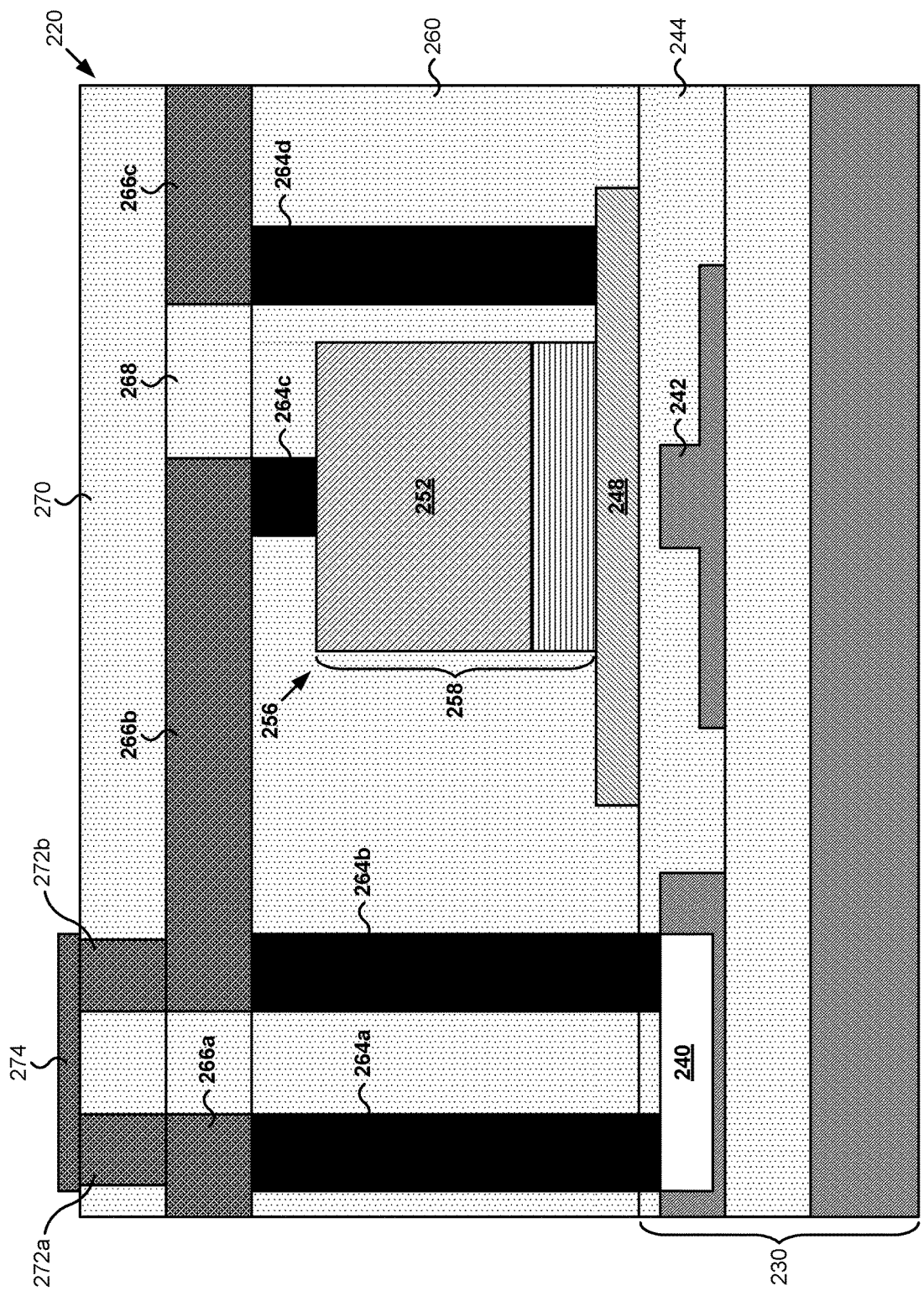
FIG. 11 illustrates a cross-sectional view of a portion of a semiconductor structure processed in accordance with the flowchart of FIG. 1B according to one implementation of the present application.

FIG. 11 illustrates a cross-sectional view of a portion of a semiconductor structure processed in accordance with action 120 in the flowchart of FIG. 1B according to one implementation of the present application. As shown in FIG. 11, in semiconductor structure 220, metal resistor 274 (that is used merely as one example of an integrated passive device (IPD) in the present application) is formed over blanket dielectric layer 260 and electrically connected to group III-V device 256. Semiconductor structure 220 also includes metallization level 268, interlayer dielectric 270, vias 272a and 272b, and metal resistor 274.

Metallization level 268 is, for example, a first metallization level and interconnect metals 266a, 266b, and 266c are situated in metallization level 268. Semiconductor structure 220 can include additional metallization levels (not shown in FIG. 11). For example, a second metallization level can be situated over interlayer dielectric 270, and metal resistor 274 can be situated in that metallization level. Metallization levels, such as metallization level 268, provide layers in which passive devices, such as metal resistor 274, and interconnect metals, such as interconnect metals 266a, 266b, and 266c, can be built as part of a back-end-of-line (BEOL) multi-level metallization (MLM). Metallization levels, such as metallization level 268, can comprise $SiO_2$, $Si_xN_y$, or another dielectric between interconnect metal and/or passive devices.

Interlayer dielectric 270 is situated over metallization level 268. Interlayer dielectric 270 provides insulation between metallization level 268 and metallization levels formed above it. Interlayer dielectric 270 also provides a layer in which vias, such as vias 272a and 272b, can be built. In various implementations, interlayer dielectric 270 can comprise $SiO_2$, $Si_xN_y$, or another dielectric. Semiconductor structure 220 can include additional interlayer dielectrics (not shown in FIG. 11).

Via 272a connects interconnect metal 266a to a first end of metal resistor 274. Via 272b connects interconnect metal 266b to a second end of metal resistor 274. Metal resistor 274 is an integrated passive device (IPD) and, in the present example, is disposed on interlayer dielectric 270. The first end of metal resistor 274 is electrically connected to a first terminal of group IV device 240 by via 272a, interconnect metal 266a, and contact metal 264a. The second end of metal resistor 274 is electrically connected to a second terminal of group IV device 240 by via 272b, interconnect metal 266b, and contact metal 264b. The second end of metal resistor 274 is also electrically connected to doped group III-V layer 252 of group III-V device 256 by via 272b, interconnect metal 266b, and contact metal 264c. Where group IV device 240 is, for example, an operational amplifier, and patterned group III-V device 256 is, for example, a photodiode, metal resistor 274 can be, for example, a feedback resistor, and metal resistor 274 and group IV device 240 can be part of a transimpedance amplifier for readout of patterned group III-V device 256. In various implementations, metal resistor 274 can comprise titanium nitride (TiN), tantalum nitride (TaN), or nickel chromium (NiCr).

In various implementations, metal resistor 274 can be disposed in any level over blanket dielectric layer 260. In various implementations, metal resistor 274 can be connected to any other structure or device in semiconductor device 220. In various implementations, semiconductor structure 220 can include other IPDs, such as capacitors and/or inductors, instead of or in addition to metal resistor 274. These IPDs can be, for example, part of a feedback, filtering, or biasing circuit, and can be electrically connected to terminals of patterned group III-V device 256 and/or group IV device 240 in a different manner than shown in FIG. 11.

Semiconductor structures according to the present invention, such as semiconductor structure 220 in FIG. 11, result in several advantages. First, patterned group III-V device 256 is integrated in the same semiconductor structure as group IV device 242 that it is optically connected to. Especially where a portion of oxide layer 244 above group I device 242 is kept thin, patterned group III-V device 256 is in close proximity to group I device 242, and optical losses are reduced.

Second, since patterned group III-V device 256 is patterned after group III-V chiplet 246 (shown in FIG. 4) is bonded to group IV substrate 230, alignment is improved. Photolithography techniques utilized to form group IV device 242 can also be utilized to form patterned group III-V device 256, such that patterned group III-V device 256 is aligned to group IV device 242. If a group III-V device were patterned prior to bonding to group IV substrate 230, inaccurate mechanical alignment of the group III-V device during the bonding could cause significant optical losses between the group III-V device and group IV device 242.

Third, because blanket dielectric layer 260 is substantially planar, semiconductor structure 220 is compatible with modern group IV BEOL MLM schemes. Conventional techniques for forming contacts for a group III-V device employ lift-off of a gold (Au) metal layer. These lift-off techniques are generally unsuitable for high aspect ratio contacts, and leave residual materials that are difficult to clean. Gold also acts as a dopant to silicon and can have unintended consequences when integrating with group IV substrate 230. Moreover, these lift-off techniques result in contacts for doped group III-V layers 248 and 252 being non-planar, one residing significantly higher than the other due to the height of group III-V mesa 258. Forming subsequent metallization levels and interlayer dielectrics over these non-planar contacts could result in extreme topographies and contours, making lithographic alignment difficult, and significantly increasing the complexity when connecting the contacts to overlying interconnect metals and vias.

In semiconductor structure 220 in FIG. 11, contact metals 264c and 264d connected to patterned group III-V device 256 are situated within and substantially planar with blanket dielectric layer 260. Accordingly, metallization level 268 and interlayer dielectric 270 do not have extreme topographies, and interconnect metals 266a, 266b, and 266c and vias 272a and 272b are easily connected to contacts metal 264c and 264d. Moreover, where etch stop layers (not shown in FIG. 11) are used, contact metals 264c and 264d can be substantially planar despite the height of group III-V mesa 258 while also preventing etching of doped group III-V layer 252 during long etching actions used to form contact holes 262a, 262b, 262c, and 262d (shown in FIG. 8).

Further, because patterned group III-V device 256 and group IV device 240 are integrated at the wafer-level and compatible with BEOL MLM schemes, semiconductor structure 220 exhibits increased connectivity and improved performance. Patterned group III-V device 256 is not separately packaged and does not need to be connected to group IV device 240, for example, using wirebonds or solder balls, which generally increase electrical losses. Rather, in semiconductor structure 220, contact metal 264c, interconnect metal 266b, and contact metal 264b create a direct path electrically connecting patterned group III-V device 256 over group I substrate 230 to group IV device 240 in group IV substrate 230. Patterned group III-V device 256 also generally experiences low losses when electrically connected to other group IV devices in group IV substrate 230, and when electrically connected to IPDs, such as metal resistor 274, over blanket dielectric layer 260.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
   a group IV substrate;
   a patterned group III-V device over said group IV substrate;
   a blanket dielectric layer over said patterned group III-V device, wherein said blanket dielectric layer is substantially planar;
   a contact metal within said blanket dielectric layer;
   an interconnect metal situated over said blanket dielectric layer;
   wherein said contact metal comprises a single metal layer directly contacting a group III-V portion of said patterned group III-V device and said interconnect metal.

2. The semiconductor structure of claim 1, wherein said contact metal is substantially planar with a top surface of said blanket dielectric layer.

3. The semiconductor structure of claim 1, further comprising a dielectric etch stop layer situated over said patterned group III-V device and under said blanket dielectric layer.

4. The semiconductor structure of claim 1, wherein said patterned group III-V device is optically connected to a group IV device in said group IV substrate.

5. The semiconductor structure of claim 4, wherein said patterned group III-V device is selected from the group consisting of a photodiode and a laser.

6. The semiconductor structure of claim 4, wherein said group IV device is selected from the group consisting of a waveguide, a grating coupler, and an interferometer.

7. The semiconductor structure of claim 1, wherein said patterned III-V device is electrically connected to a group IV device in said group IV substrate.

8. The semiconductor structure of claim 7, wherein said group IV device is a group IV transistor.

9. The semiconductor structure of claim 1, wherein said patterned III-V device is electrically connected to an integrated passive device (IPD) over said blanket dielectric layer.

10. The semiconductor structure of claim 1, wherein said patterned group III-V device comprises a group III-V mesa having a height greater than or approximately equal to two microns (2 µm).

11. A method comprising:
    providing a group IV substrate and a group III-V chiplet;
    bonding said group III-V chiplet to said group IV substrate;
    patterning said group III-V chiplet to produce a patterned group III-V device;
    forming a blanket dielectric layer over said patterned group III-V device;
    planarizing said blanket dielectric layer;
    forming contact holes in said blanket dielectric layer;
    depositing a contact metal in said contact holes;
    forming an interconnect metal over said blanket dielectric layer;
    wherein said contact metal comprises a single metal layer directly contacting a group III-V portion of said patterned group III-V device and said interconnect metal.

12. The method of claim 11, further comprising planarizing said contact metal with a top surface of said blanket dielectric layer.

13. The method of claim 11, further comprising a dielectric etch stop layer situated over said patterned group III-V device and under said blanket dielectric layer.

14. The method of claim 11, wherein said patterned group III-V device is optically connected to a group IV device in said group IV substrate.

15. The method of claim 14, wherein said patterned group III-V device is selected from the group consisting of a photodiode and a laser.

16. The method of claim 14, wherein said group IV device is selected from the group consisting of a waveguide, a grating coupler, and an interferometer.

17. The method of claim 11, wherein said patterned III-V device is electrically connected to a group IV device in said group IV substrate.

18. The method of claim 17, wherein said group IV device is a group IV transistor.

19. The method of claim 11, further comprising:
    forming an integrated passive device (IPD) over said blanket dielectric layer; and
    electrically connecting said IPD to said patterned III-V device.

20. The method of claim 11, wherein said patterned group III-V device comprises a group III-V mesa having a height greater than or approximately equal to two microns (2 µm).

* * * * *